United States Patent
Shen et al.

(10) Patent No.: US 7,795,079 B2
(45) Date of Patent: Sep. 14, 2010

(54) MANUFACTURING PROCESS FOR A QUAD FLAT NON-LEADED CHIP PACKAGE STRUCTURE

(75) Inventors: Geng-Shin Shen, Tainan County (TW); Chun-Ying Lin, Tainan County (TW)

(73) Assignees: ChipMoS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 177 days.

(21) Appl. No.: 12/270,655

(22) Filed: Nov. 13, 2008

(65) Prior Publication Data
US 2009/0068799 A1    Mar. 12, 2009

Related U.S. Application Data

(63) Continuation-in-part of application No. 11/326,749, filed on Jan. 5, 2006, now Pat. No. 7,560,306.

(30) Foreign Application Priority Data
Jul. 21, 2005    (TW) .............................. 94124656 A

(51) Int. Cl.
*H01L 21/44*    (2006.01)

(52) U.S. Cl. ............... 438/126; 257/686; 257/E21.499; 438/108; 438/617

(58) Field of Classification Search ................ 257/686, 257/E21.499; 438/108, 109, 126, 617
See application file for complete search history.

(56) References Cited

U.S. PATENT DOCUMENTS

| 6,001,671 A | 12/1999 | Fjelstad |
| 6,448,506 B1 | 9/2002 | Glenn et al. |
| 7,091,581 B1 | 8/2006 | McLellan et al. |
| 2002/0039808 A1 | 4/2002 | Fukutomi et al. |
| 2006/0223234 A1 | 10/2006 | Terayama et al. ........... 438/113 |

FOREIGN PATENT DOCUMENTS

CN    1501488    6/2004

OTHER PUBLICATIONS

U.S. Office Action of U.S. Appl. No. 11/326,2006, dated Dec. 5, 2008.

*Primary Examiner*—Asok K Sarkar
(74) *Attorney, Agent, or Firm*—J.C. Patents

(57) ABSTRACT

A manufacturing process for a Quad Flat Non-leaded (QFN) chip package structure is provided. First, a conductive layer having a plurality of recesses and a patterned solder resist layer on the conductive layer are provided, wherein the patterned solder resist layer covers the recesses of the conductive layer. A plurality of chips are bonded onto the patterned solder resist layer such that the patterned solder resist layer is between the chips and the conductive layer. The chips are electrically connected to the conductive layer by a plurality of bonding wires. At least one molding compound is formed to encapsulate the conductive layer, the patterned solder resist layer, the chips and the bonding wires. A part of the conductive layer exposed by the patterned solder resist layer is removed so as to form a patterned conductive layer. Then, the molding compound and the patterned conductive layer are separated.

28 Claims, 6 Drawing Sheets

MANUFACTURING PROCESS FOR A QUAD FLAT NON-LEADED CHIP PACKAGE STRUCTURE

CROSS-REFERENCE TO RELATED APPLICATION

This application is a continuation-in-part of U.S. application Ser. No. 11/326,749, filed on Jan. 5, 2006, all disclosure is incorporated therewith. The prior application Ser. No. 11/326,749 claims the priority benefit of Taiwan application serial no. 94124656, filed on Jul. 21, 2005. The entirety of each of the above-mentioned patent applications is hereby incorporated by reference herein and made a part of this specification.

BACKGROUND OF THE INVENTION

1. Field of the Invention

The present invention relates to a manufacturing process for a chip package structure. More particularly, the present invention relates to a manufacturing process for a Quad Flat Non-leaded (QFN) chip package structure.

2. Description of Related Art

The semiconductor industries have bee highly developed. With the trends of electrification, electronic and semiconductor devices are widely used in the daily life, including entertainment, education, transportation and households. The design of the electrical products becomes more complex, smaller-sized, light-weight and humanized, in order to offer more convenience for the consumers. In the package structures, the leadframe is one of the most commonly used elements, applied in various package products. Based on the type of leadframes, the Quad Flat Packages (QFP) can be categorized as quad flat chip package with "I" lead (QFI), quad flat chip package with "J" lead (QFJ) and Quad Flat Non-leaded (QFN) chip package. Because leads of the leadframe in the QFN chip package end at the edges of the chip package structure, the QFN chip package has a small size. Since the QFN chip package provides shorter electrical path and faster signal transmission, the QFN chip package has been widely used as low pin count solutions for power elements.

In general, in the fabricating process of a QFN chip package, a plurality of chips are disposed on the leadframe, wherein the leadframe includes a plurality of lead sets connected to each other and each chip is surrounded by one lead set. Each chip is electrically connected to one lead set through wire bonding. Then, at least one molding compound is formed to encapsulate the leadframe, the chips and the bonding wires. Finally, a plurality of QFN chip packages are formed through a singulation process, wherein the sigulation process includes a punch process or a sawing process.

SUMMARY OF THE INVENTION

The present invention is to provide a manufacturing process for a QFN chip package structure having small thickness.

As embodied and broadly described herein, the present invention provides a manufacturing process for a Quad Flat Non-leaded (QFN) chip package structure. First, a conductive layer having a plurality of recesses and a first patterned solder resist layer on the conductive layer are provided, wherein the first patterned solder resist layer and the recesses are at two opposite sides of the conductive layer. A part of the conductive layer exposed by the first patterned solder resist layer is removed so as to form a patterned conductive layer. A plurality of chips are bonded onto the first patterned solder resist layer such that the first patterned solder resist layer is between the chips and the conductive layer. The chips are electrically connected to the conductive layer by a plurality of bonding wires. At least one molding compound is formed to encapsulate the conductive layer, the first patterned solder resist layer, the chips and the bonding wires. Then, the molding compound and the patterned conductive layer are separated.

According to an embodiment of the present invention, a plurality of first openings and a plurality of second openings are formed on the first patterned solder resist layer, wherein a part of the conductive layer are exposed by the first openings and the second openings.

According to an embodiment of the present invention, the manufacturing process for a QFN chip package structure further includes forming an adhesive layer between the chips and the first patterned solder resist layer.

According to an embodiment of the present invention, the adhesive layer is a B-staged adhesive layer.

According to an embodiment of the present invention, the B-staged adhesive layer is formed on a rear surface of the chip in advance.

According to an embodiment of the present invention, the B-staged adhesive layer is formed on the patterned conductive layer before the chip is attached on the patterned conductive layer.

According to an embodiment of the present invention, the first patterned solder resist layer is a B-staged layer.

According to an embodiment of the present invention, the B-staged layer is photosensitive.

As embodied and broadly described herein, the present invention provides another manufacturing process for a Quad Flat Non-leaded (QFN) chip package structure. First, a conductive layer having a plurality of recesses and a first patterned solder resist layer on the conductive layer are provided, wherein the first patterned solder resist layer and the recesses are at two opposite sides of the conductive layer. A part of the conductive layer exposed by the first patterned solder resist layer is removed so as to form a patterned conductive layer. A plurality of chips are bonded onto the conductive layer such that the first patterned solder resist layer and the chips are at the same side of the conductive layer. The chips are electrically connected to the conductive layer by a plurality of bonding wires. At least one molding compound is formed to encapsulate the conductive layer, the first patterned solder resist layer, the chips and the bonding wires. Then, the molding compound and the patterned conductive layer are separated.

According to an embodiment of the present invention, a method for providing the conductive layer having a plurality of recesses and the first patterned solder resist layer includes providing a conductive layer having a plurality of recesses, forming a solder resist layer on the conductive layer, and patterning the solder resist layer to form the first patterned solder resist layer, wherein a part of the conductive layer is exposed by the first patterned solder resist layer.

According to an embodiment of the present invention, the manufacturing process for a QFN chip package structure further includes forming a second patterned solder resist layer in the recesses of the conductive layer before removing a part of the conductive layer exposed by the first patterned solder resist layer.

According to an embodiment of the present invention, a plurality of die pads and a plurality of leads are formed on the patterned conductive layer.

According to an embodiment of the present invention, a plurality of first openings, a plurality of second openings and a plurality of third openings are formed on the first patterned solder resist layer, wherein a part of the conductive layer are exposed by the first openings, the second openings and the third openings.

According to an embodiment of the present invention, each of the first openings is corresponding to one of the recesses.

According to an embodiment of the present invention, the bonding wires are electrically connected to the patterned conductive layer through the second openings.

According to an embodiment of the present invention, the chips are bonded onto the conductive layer exposed by the third openings.

According to an embodiment of the present invention, the manufacturing process for a QFN chip package structure further includes forming an adhesive layer between the chips and the conductive layer.

According to an embodiment of the present invention, the conductive layer has a first surface with the recesses and a second surface opposite to the first surface.

According to an embodiment of the present invention, a method for removing a part of the conductive layer exposed by the first patterned solder resist layer includes etching a part of the conductive layer from the second surface.

In summary, the manufacturing process for the QFN chip package structure of the present invention can produce the QFN chip package having a solder resist layer to enhance the structure strength of the QFN chip package, such that the thickness of the patterned conductive layer can be decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
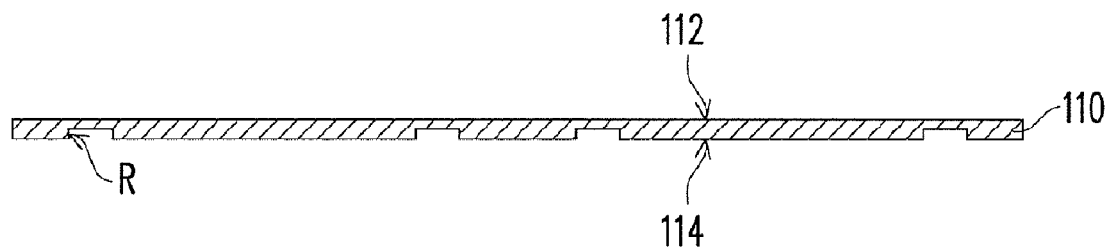
FIG. 1A to FIG. 1K are cross-sectional views schematically illustrating the manufacturing process for the QFN chip package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1K are cross-sectional views schematically illustrating the manufacturing process for the QFN chip package structure according to an embodiment of the present invention. Referring to FIG. 1A, a conductive layer 110 having a first surface 114 and a second surface 112 is provided, and the conductive layer 110 at predetermined regions is partially removed such that a plurality of recesses R are formed on the first surface 114 of the conductive layer 110. In the present embodiment, the recesses R on the first surface 114 are formed by a half-etching process or a stamping process.

Figure 1B:
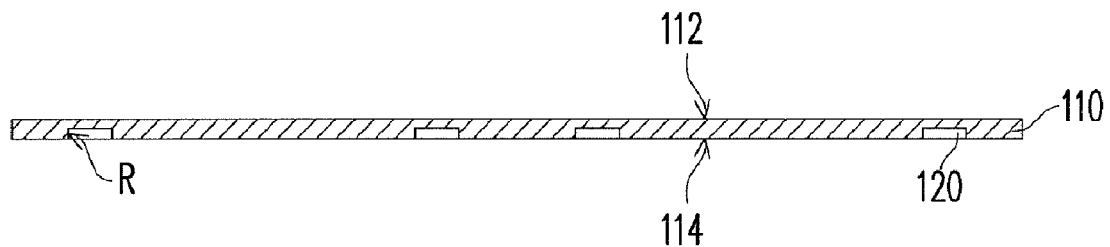
Figure 1C:
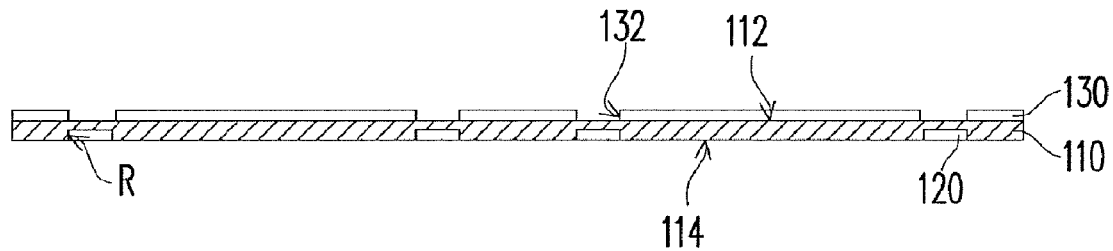

Referring to FIG. 1B, a second patterned solder resist layer 120 is formed at the region of the recesses R formed on the first surface 114 of the conductive layer 110, such that the recesses R are filled with the second patterned solder resist layer 120. Referring to FIG. 1C, a first patterned solder resist layer 130 having a plurality of first openings 132 is then formed on the second surface 112 of the conductive layer 110, wherein each of the first openings 132 are corresponding to one of the recesses R, and a part of the second surface 112 is exposed by the first openings 132. In a preferred embodiment, a brown oxidation or a black oxidation process can further be performed on the conductive layer 110 to improve the surface roughness of the conductive layer 110. Accordingly, the combination between the conductive layer 110 and the first patterned solder resist layer 130 is improved.

Figure 1D:
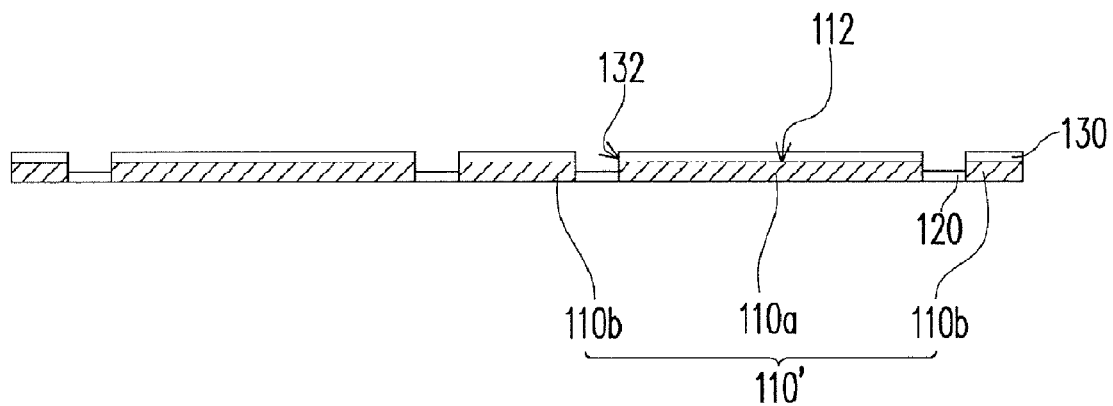
Figure 1E:
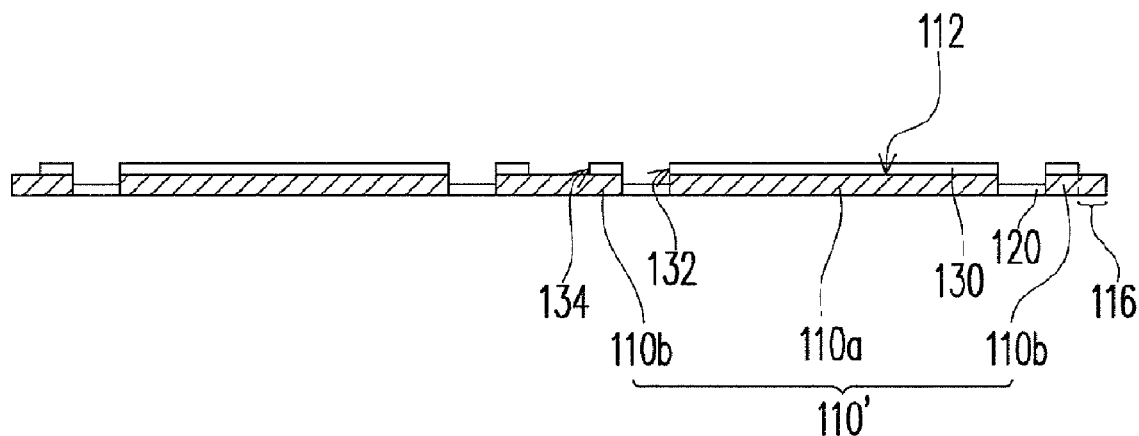

Referring to FIG. 1D, the conductive layer 110 exposed by the first openings 132 is removed by etching for forming a patterned conductive layer 110', wherein the patterned conductive layer 110' has a plurality of die pads 110a and a plurality of leads 110b. Referring to FIG. 1E, a plurality of second openings 134 are formed on the first patterned solder resist layer 130, wherein a part of the second surface 112 is exposed by the second openings 134. In other words, a plurality of first bonding pads 116 are defined by the first patterned solder resist layer 130 formed on a part of the second surface 112.

In the present embodiment, the first patterned solder resist layer 130 may be a B-staged film, which is also a solder resist film, and the first openings 132 and the second openings 134 are formed before or after the first patterned solder resist layer 130 being attached onto the conductive layer 110. In an alternative embodiment, the first patterned solder resist layer 130 may be formed by coated a liquid solder resist on the second surface 112 of the conductive layer 110 first, and the liquid solder resist should be cured and patterned to form the first patterned solder resist layer 130 after being coated on the second surface 112 of the conductive layer 110, and the liquid solder resist could be a B-staged liquid solder resist. In this embodiment, the first patterned solder resist layer 130, for example, is a B-staged film. Furthermore, the first patterned solder resist layer 130 could be a B-staged film which is photosensitive.

Additionally, in a preferred embodiment, a plating process may be performed so as to form a plating conductive layer (not shown) on the first bonding pads 116. The plating conductive layer may be a Ni/Au stacked layer, or other suitable metal layers. It is noted that the plating conductive layer may be formed before or after the first patterned solder resist layer 130 is formed on the conductive layer 110.

Figure 1F:
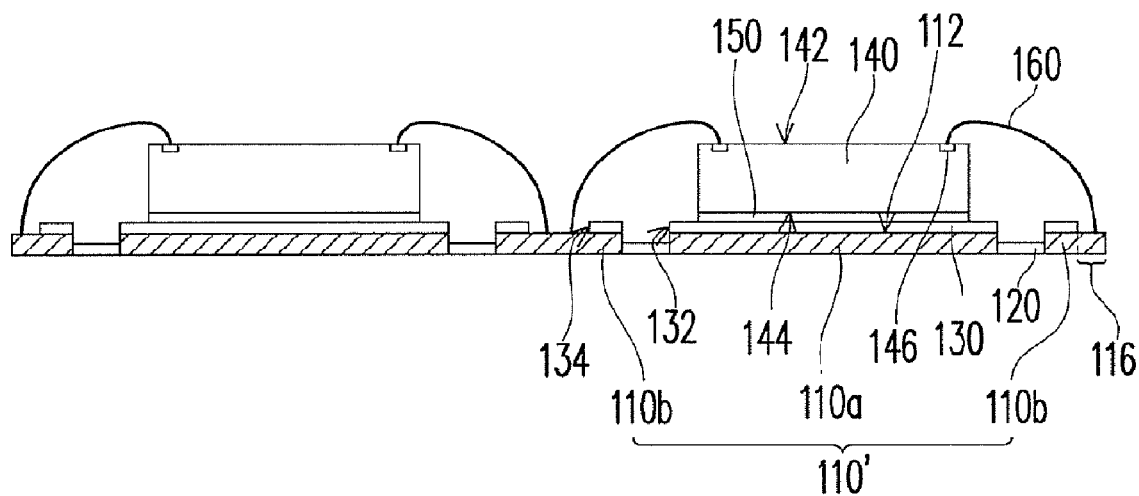

Referring to FIG. 1F, a plurality of chips 140 are adhered to the first patterned solder resist layer 130 and a plurality of bonding wires 160 are then formed to connect the chips 140 and the patterned conductive layer 110', wherein each chip 140 has an active surface 142, a rear surface 144 opposite to the active surface 142 and a plurality of second bonding pads 146 disposed on the active surface 142. Each chip 140 is adhered on the first patterned solder resist layer 130 by an adhesive layer 150 between the chip 140 and the patterned conductive layer 110' such that the first solder patterned resist layer 130 is between the patterned conductive layer 110' and each chip 140. In an alternative embodiment, the chips 140 could be adhered on the patterned solder resist layer 130 without the adhesive layer 150, wherein the patterned solder resist layer 130 is a B-staged layer formed on the leads 110b and the die pads 110a without being fully cured before the chips 140 are attached.

In the present embodiment, the bonding wires 160 are formed by a wire bonding process, such that each bonding wire 160 is electrically connected between a first bonding pad 116 and a second bonding pad 146. The bonding wires 160 are, for example, Au wires.

In the present embodiment, the adhesive layer 150 is a B-staged adhesive layer, for example. The B-staged adhesive layer can be obtained from 8008 or 8008HT of ABLESTIK. Additionally, the B-staged adhesive layer can also be obtained from 6200, 6201 or 6202C of ABLESTIK, or obtained from SA-200-6, SA-200-10 provided by HITACHI Chemical CO., Ltd. In an embodiment of the present invention, the B-staged adhesive layer 150 is formed on the rear surface of a wafer. When the wafer is separated, a plurality of chip 140 having the adhesive layer 150 on the rear surface 144 thereof is obtained. Therefore, the B-staged adhesive layer 150 is favorable to mass production. Additionally, the B-staged adhesive layer 150 may be formed by spin-coating, printing, or other suitable processes. More specifically, the adhesive layer 150 is formed on the rear surface 144 of the chip 140 in advance. Specifically, a wafer having a plurality of chip 140 arranged in an array is first provided. Then, a two-stage adhesive layer is formed over the rear surface 144 of the chip 140 and is partially cured by heating or UV irradiation to form the B-staged adhesive layer 150. Sometimes, the B-staged adhesive layer 150 could be formed on the first patterned solder resist layer 130 before the chip 140 being attached on the first patterned solder resist layer 130.

In the present embodiment, the B-staged adhesive layer 150 is fully cured after the chip 140 being attached to the first patterned solder resist layer 130 or later by a post cured or being encapsulated by the molding compound 170.

Figure 1G:
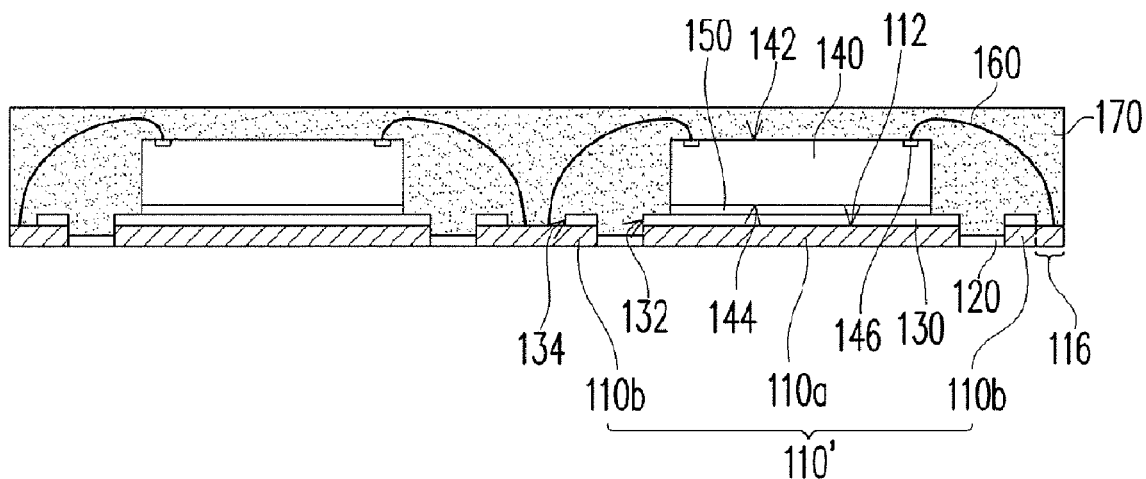

Referring to FIG. 1G, at least one molding compound 170 encapsulating the patterned conductive layer 110', the first patterned solder resist layer 130, the second patterned solder resist layer 120, the chip 140 and the bonding wires 160 is formed. The material of the molding compound 160 is, for example, epoxy resin.

Figure 1H:
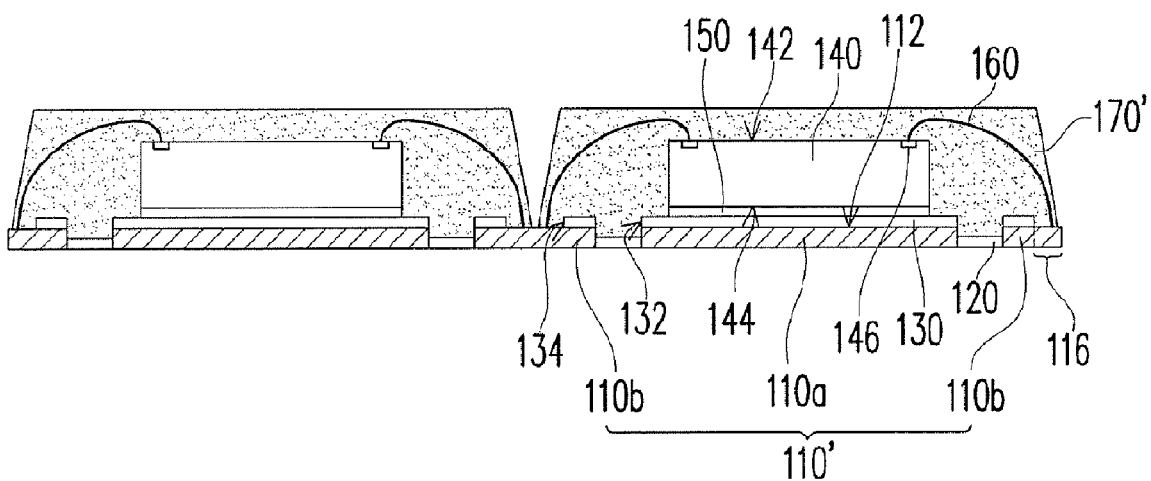

Referring to FIG. 1H, instead of forming a molding compound 170 encapsulating the patterned conductive layer 110', the first patterned solder resist layer 130, the second patterned solder resist layer 120, the chip 140 and the bonding wires 160, a plurality of molding compound 170' could be formed to encapsulate the patterned conductive layer 110', the first patterned solder resist layer 130, the second patterned solder resist layer 120, the chip 140 and the bonding wires 160.

Figure 1I:
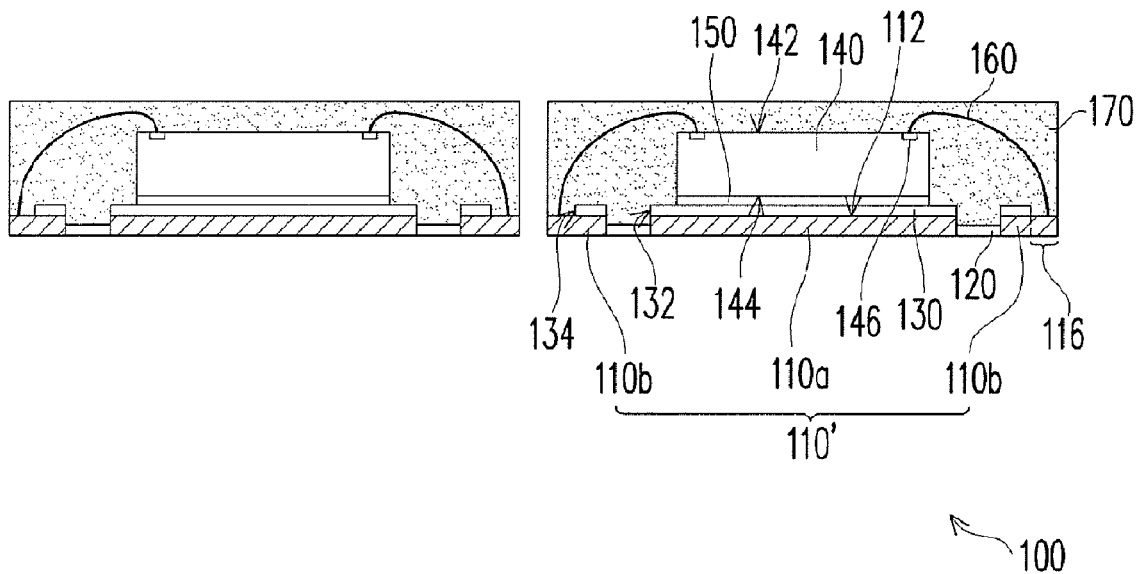
Figure 1J:
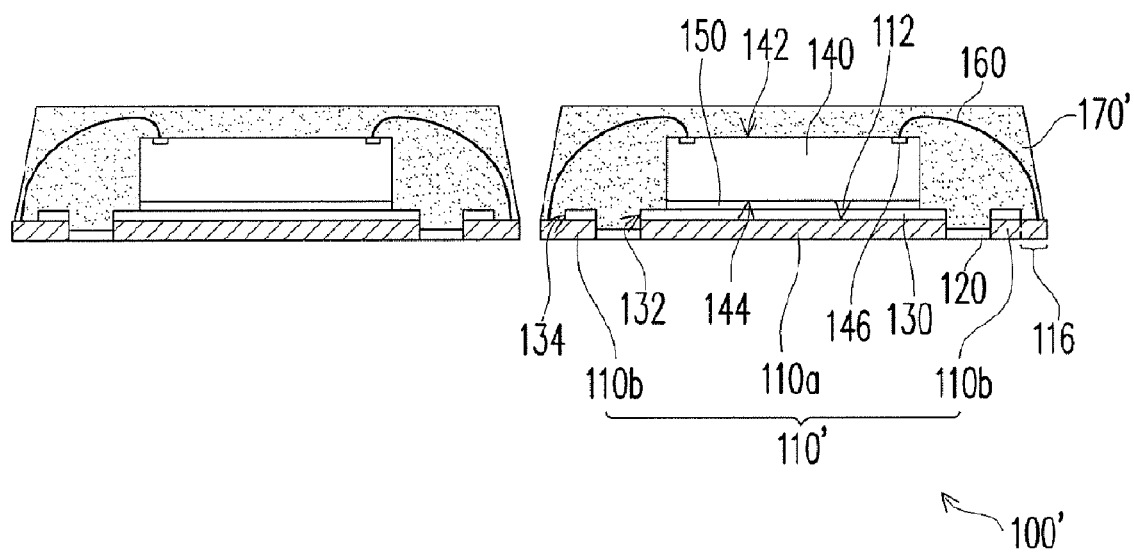

Referring to FIG. 1I and FIG. 1J, a singulation process is performed for forming a plurality of QFN chip packages 100 (shown in FIG. 1I) or a plurality of QFN chip packages 100' (shown in FIG. 1J), wherein the singulation process comprises a punch process or a sawing process.

As shown in FIG. 1I, the QFN chip package 100 of the present invention mainly includes a patterned conductive layer 110', a first patterned solder resist layer 130, a second patterned solder resist layer 120, a chip 140, a plurality of bonding wires 160 and a molding compound 170. The patterned conductive layer 110' has a first surface 114 and a second surface 112 opposite to each other, wherein the patterned conductive layer 110' has a die pad 110a and a plurality of leads 110b surrounding the die pad 110a, and the first patterned solder resist layer 130 is disposed on the second surface 112 of the patterned conductive layer 110', wherein a part of the second surface 112 is exposed by the first patterned solder resist layer 130. The second patterned solder resist layer 120 disposed between the die pad 110a and the leads 110b without contacting with the first patterned solder resist layer 130. The chip 140 is disposed on the first patterned solder resist layer 130, wherein the first patterned solder resist layer 130 is between the patterned conductive layer 110' and the chip 140. The bonding wires 160 are electrically connected to the chip 140 and the patterned conductive layer 110' exposed by the first patterned solder resist layer 130. The molding compound 170 encapsulates the pattern conductive layer 110', the first patterned solder resist layer 130, the second patterned solder resist layer 120, the chip 140 and the bonding wires 160.

Figure 1K:
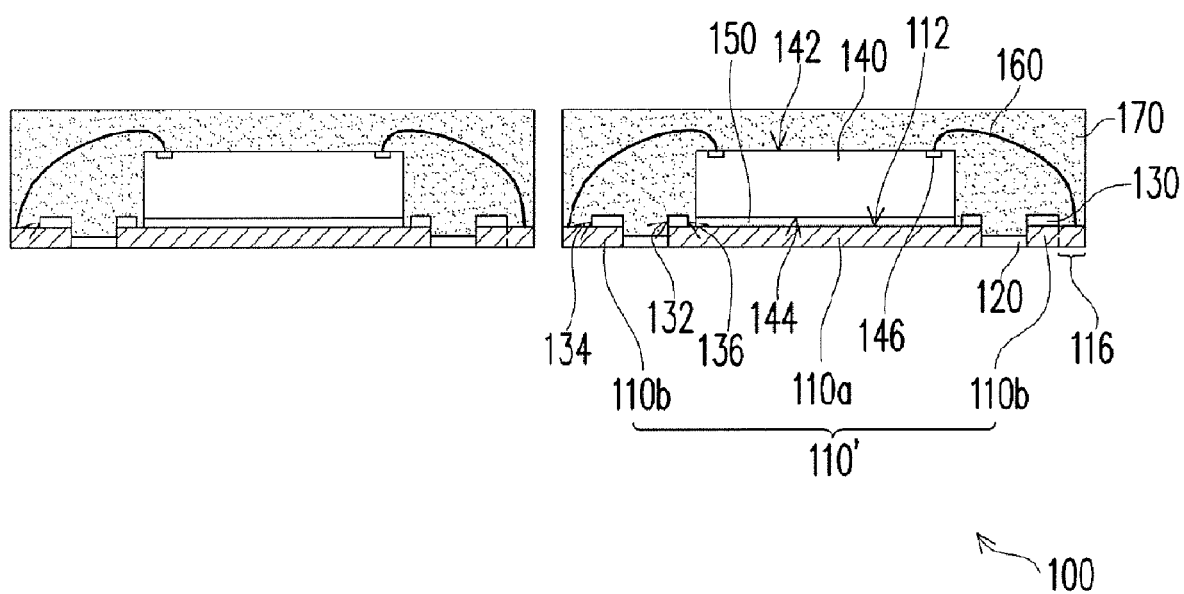

Referring to FIG. 1K, in an alternative embodiment, a plurality of third openings 136 may be formed on the first patterned solder resist layer 130, such that each chip 140 is disposed in one of the third openings 136 and is adhered on the second surface 112 exposed by the first patterned solder resist layer 130 by the adhesive layer 150. In the present embodiment, the adhesive layer 150 is a B-staged adhesive layer, a conductive layer or a non conductive layer, for example.

Compared with the conventional manufacturing process for a QFN chip package structure, the manufacturing process of the present invention can produce the QFN chip package having a solder resist layer to enhance the structure strength of the QFN chip package, such that the thickness of the patterned conductive layer can be decreased. Additionally, the overall thickness of the QFN chip package is decreased and the production cost is lowered, such that the throughput is improved in the present invention.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for a Quad Flat Non-leaded (QFN) chip package structure, comprising:
   providing a conductive layer having a plurality of recesses and a first patterned solder resist layer on the conductive layer, wherein the first patterned solder resist layer and the recesses are at two opposite sides of the conductive layer;
   removing a part of the conductive layer exposed by the first patterned solder resist layer forming a patterned conductive layer;
   bonding a plurality of chips onto the first patterned solder resist layer such that the first patterned solder resist layer is between the chips and the conductive layer;
   electrically connecting the chips to the conductive layer by a plurality of bonding wires;
   forming at least one molding compound to encapsulate the conductive layer, the first patterned solder resist layer, the chips and the bonding wires; and
   separating the molding compound and the patterned conductive layer.

2. The manufacturing process for a QFN chip package structure as claimed in claim 1, wherein a method for providing the conductive layer having a plurality of recesses and the first patterned solder resist layer comprises:
   providing a conductive layer having a plurality of recesses;
   forming a solder resist layer on the conductive layer; and
   patterning the solder resist layer to form the first patterned solder resist layer, wherein a part of the conductive layer is exposed by the first patterned solder resist layer.

3. The manufacturing process for a QFN chip package structure as claimed in claim 1, further comprising forming a second patterned solder resist layer in the recesses of the conductive layer before removing a part of the conductive layer exposed by the first patterned solder resist layer.

4. The manufacturing process for a QFN chip package structure as claimed in claim 1, wherein a plurality of die pads and a plurality of leads are formed on the patterned conductive layer.

5. The manufacturing process for a QFN chip package structure as claimed in claim 1, wherein a plurality of first openings and a plurality of second openings are formed on the first patterned solder resist layer, wherein a part of the conductive layer are exposed by the first openings and the second openings.

6. The manufacturing process for a QFN chip package structure as claimed in claim 5, wherein each of the first openings is corresponding to one of the recesses.

7. The manufacturing process for a QFN chip package structure as claimed in claim 5, wherein the bonding wires are electrically connected to the patterned conductive layer through the second openings.

8. The manufacturing process for a QFN chip package structure as claimed in claim 1, further comprising forming an adhesive layer between the chips and the first patterned solder resist layer.

9. The manufacturing process for a QFN chip package structure as claimed in claim 8, wherein the adhesive layer is a B-staged adhesive layer.

10. The manufacturing process for a QFN chip package structure as claimed in claim 9, wherein the B-staged adhesive layer is formed on a rear surface of the chip in advance.

11. The manufacturing process for a QFN chip package structure as claimed in claim 9, wherein the B-staged adhesive layer is formed on the patterned conductive layer before the chip is attached on the patterned conductive layer.

12. The manufacturing process for a QFN chip package structure as claimed in claim 1, wherein the first patterned solder resist layer is a B-staged layer.

13. The manufacturing process for a QFN chip package structure as claimed in claim 12, wherein the B-staged layer is photosensitive.

14. The manufacturing process for a QFN chip package structure as claimed in claim 1, wherein the conductive layer has a first surface with the recesses and a second surface opposite to the first surface.

15. The manufacturing process for a QFN chip package structure as claimed in claim 14, wherein a method for removing a part of the conductive layer exposed by the first patterned solder resist layer comprises etching a part of the conductive layer from the second surface.

16. The manufacturing process for a QFN chip package structure as claimed in claim 1, wherein a brown oxidation or a black oxidation process can further be performed on the conductive layer.

17. A manufacturing process for a Quad Flat Non-leaded (QFN) chip package structure, comprising:
providing a conductive layer having a plurality of recesses and a first patterned solder resist layer on the conductive layer, wherein the first patterned solder resist layer and the recesses are at different sides of the conductive layer;
removing a part of the conductive layer exposed by the first patterned solder resist layer forming a patterned conductive layer;
bonding a plurality of chips onto the conductive layer such that the first patterned solder resist layer and the chips are at the same side of the conductive layer;
electrically connecting the chips to the conductive layer by a plurality of bonding wires;
forming at least one molding compound to encapsulate the conductive layer, the first patterned solder resist layer, the chips and the bonding wires; and
separating the molding compound and the patterned conductive layer.

18. The manufacturing process for a QFN chip package structure as claimed in claim 17, wherein a method for providing the conductive layer having a plurality of recesses and the first patterned solder resist layer comprises:
providing a conductive layer having a plurality of recesses;
forming a solder resist layer on the conductive layer; and
patterning the solder resist layer to form the first patterned solder resist layer, wherein a part of the conductive layer is exposed by the first patterned solder resist layer.

19. The manufacturing process for a QFN chip package structure as claimed in claim 17, further comprising forming a second patterned solder resist layer in the recesses of the conductive layer before removing a part of the conductive layer exposed by the first patterned solder resist layer.

20. The manufacturing process for a QFN chip package structure as claimed in claim 17, wherein a plurality of die pads and a plurality of leads are formed on the patterned conductive layer.

21. The manufacturing process for a QFN chip package structure as claimed in claim 17, wherein a plurality of first openings, a plurality of second openings and a plurality of third openings are formed on the first patterned solder resist layer, wherein a part of the conductive layer are exposed by the first openings, the second openings and the third openings.

22. The manufacturing process for a QFN chip package structure as claimed in claim 21, wherein each of the first openings is corresponding to one of the recesses.

23. The manufacturing process for a QFN chip package structure as claimed in claim 21, wherein the bonding wires are electrically connected to the patterned conductive layer through the second openings.

24. The manufacturing process for a QFN chip package structure as claimed in claim 21, wherein the chips are bonded onto the conductive layer exposed by the third openings.

25. The manufacturing process for a QFN chip package structure as claimed in claim 17, further comprising forming an adhesive layer between the chips and the conductive layer.

26. The manufacturing process for a QFN chip package structure as claimed in claim 17, wherein the conductive layer has a first surface with the recesses and a second surface opposite to the first surface.

27. The manufacturing process for a QFN chip package structure as claimed in claim 17, wherein a method for removing a part of the conductive layer exposed by the first patterned solder resist layer comprises etching a part of the conductive layer from the second surface.

28. The manufacturing process for a QFN chip package structure as claimed in claim 17, wherein a brown oxidation or a black oxidation process can further be performed on the conductive layer.

* * * * *